(12) United States Patent
Hashemi et al.

(10) Patent No.: US 12,063,867 B2
(45) Date of Patent: Aug. 13, 2024

(54) DUAL SPACER FOR DOUBLE MAGNETIC TUNNEL JUNCTION DEVICES

(71) Applicant: International Business Machines Corporation, Armonk, NY (US)

(72) Inventors: Pouya Hashemi, Purchase, NY (US); Chandrasekharan Kothandaraman, New York, NY (US); Nathan P. Marchack, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 17/394,752

(22) Filed: Aug. 5, 2021

(65) Prior Publication Data

US 2023/0039834 A1 Feb. 9, 2023

(51) Int. Cl.
| | |
|---|---|
| *H10N 50/10* | (2023.01) |
| *G11C 11/16* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10N 50/10* (2023.02); *H10B 61/00* (2023.02); *H10N 50/01* (2023.02); *H10N 50/80* (2023.02); *H10N 50/85* (2023.02); *G11C 11/161* (2013.01)

(58) Field of Classification Search
None
See application file for complete search history.

(56) References Cited

U.S. PATENT DOCUMENTS

| 6,185,080 B1* | 2/2001 | Gill ...................... G01R 33/098 |
| | | 365/158 |
| 6,275,363 B1* | 8/2001 | Gill ........................ B82Y 10/00 |
| 10,692,927 B1* | 6/2020 | Gottwald ............... H10B 61/10 |
| 11,501,810 B2* | 11/2022 | Worledge ............... H10N 50/10 |
| 2011/0141804 A1 | 6/2011 | Apalkov |
| 2011/0235217 A1 | 9/2011 | Chen |

(Continued)

FOREIGN PATENT DOCUMENTS

| CN | 10413478 A * | 11/2014 |
| CN | 105374936 A | 3/2016 |

(Continued)

OTHER PUBLICATIONS

Derwent translation of CN 104134748 A (Year: 2014).*

(Continued)

*Primary Examiner* — Kevin M Bernatz
(74) *Attorney, Agent, or Firm* — Edward J. Wixted, III

(57) ABSTRACT

An approach to provide a structure of a double magnetic tunnel junction device with two spacers that includes a bottom magnetic tunnel junction stack, a spin conducting layer on the bottom magnetic tunnel junction stack, a top magnetic tunnel junction stack on the spin conduction layer, a first dielectric spacer on sides of the top magnetic tunnel junction stack and a portion of a top surface of the spin conduction layer, and a second dielectric spacer on the first (Continued)

spacer. The double magnetic tunnel device includes the top magnetic tunnel junction stack with a width that is less than the width of the bottom magnetic tunnel junction stack.

17 Claims, 11 Drawing Sheets

(56) References Cited

U.S. PATENT DOCUMENTS

| | | | | |
|---|---|---|---|---|
| 2012/0120719 A1* | 5/2012 | Worledge | ............ | G11C 11/1675 365/158 |
| 2015/0280112 A1 | 10/2015 | Li | | |
| 2016/0190432 A1 | 6/2016 | Shum | | |
| 2017/0069834 A1 | 3/2017 | Annapragada | | |
| 2018/0248112 A1 | 8/2018 | Chuang | | |
| 2018/0269383 A1 | 9/2018 | Briggs | | |
| 2020/0106000 A1 | 4/2020 | Chiu | | |
| 2021/0098530 A1* | 4/2021 | Manfrini | ................ | H10N 50/10 |
| 2021/0135090 A1 | 5/2021 | Sun | | |
| 2022/0406841 A1* | 12/2022 | Marchack | .............. | H10B 61/00 |
| 2022/0416156 A1* | 12/2022 | Hashemi | ................ | H10N 50/85 |
| 2023/0165155 A1* | 5/2023 | Hashemi | ................ | H10N 50/80 257/421 |

FOREIGN PATENT DOCUMENTS

| | | | | |
|---|---|---|---|---|
| EP | 1320104 A1 | * | 6/2003 | |
| EP | 1320104 A1 | * | 6/2003 | ............. B82Y 10/00 |
| TW | 571435 B | * | 1/2004 | |

OTHER PUBLICATIONS

Derwent translation of TW 571435 B (Year: 2004).*

"Patent Cooperation Treaty PCT Notification of Transmittal of the International Search Report and the Written Opinion of the International Searching Authority, or the Declaration", Applicant's file reference P202002887, International application No. PCT/EP2022/071056, International filing date Jul. 27, 2022 (Jul. 27, 2022), Date of Mailing Dec. 5, 2022 (May 12, 2022), 14 pages.

Hashemi, et al., "Double Magnetic Tunnel Junction Device", U.S. Appl. No. 17/128,330, filed Dec. 21, 2020, 31 p.

Zhang, et al., "Spin torque oscillation modes of a dual magnetic tunneling junction", Journal of Applied Physics 109, 07D307, 2011, 4 pgs., © 2011 American Institute of Physics, <https://aip.scitation.org/doi/10.1063/1.3536538>.

* cited by examiner

DUAL SPACER FOR DOUBLE MAGNETIC TUNNEL JUNCTION DEVICES

BACKGROUND OF THE INVENTION

The present invention relates generally to the field of semiconductor memory device technology and more particularly to magnetoresistive random-access memory devices.

Conventional MRAM devices include a magnetic tunnel junction (MTJ) structure having magnetic (e.g., ferromagnetic) layers separated by an intermediary non-magnetic tunnel barrier layer. Digital information can be stored in the memory element and can be represented by directions of magnetization vectors. In response to the voltage applied to the MTJ, the magnetic memory element exhibits different resistance values and allows an MRAM device to provide information stored in the magnetic memory element. MRAM technology is evolving to include two MTJs vertically aligned in an MRAM device. Double MTJs (DMTJ) with a bottom MTJ that is wider than the top MTJ provides double spin-current sourcing (DSTT) for the MRAM device.

SUMMARY

Embodiments of the present invention provide a structure of a double magnetic tunnel junction device that includes a bottom magnetic tunnel junction stack, a spin conducting layer on the bottom magnetic tunnel junction stack, a top magnetic tunnel junction stack on the spin conduction layer, a first dielectric spacer on sides of the top magnetic tunnel junction stack and a portion of a top surface of the spin conduction layer, and a second dielectric spacer on the first spacer. The double magnetic tunnel device includes the top magnetic tunnel junction stack with a width that is less than the width of the bottom magnetic tunnel junction stack.

Embodiments of the present invention provide a method of forming a double magnetic tunnel junction device that includes forming a via in a via dielectric on a portion of metal layer in the back-end of a line semiconductor structure and depositing a stack of material layers for a double magnetic tunnel junction device on the via and the via dielectric. The method includes patterning and selectively etching a portion of a hardmask and an organic mask on a top portion of the stack of material layers. The method includes etching a portion of each an etch stop layer, a top magnetic tunnel junction, and a top portion of a spin conduction layer in the stack of material layers using one or more of ion beam etching processes and reactive ion etching process. The method includes depositing a first spacer material over the back-end of the line semiconductor structure and depositing a second spacer material over the first spacer material. Furthermore, the method includes removing horizontal portions of the first spacer material and the second spacer material. The method includes using one or more of ion beam etching processes and reactive ion etching processes for removing portions of the first spacer, the spin conduction layer, the bottom magnetic tunnel junction in the stack of material layers for the double magnetic tunnel junction device, and a portion of a surface of the via dielectric, wherein the removed portions are not protected by a sidewall of the second spacer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
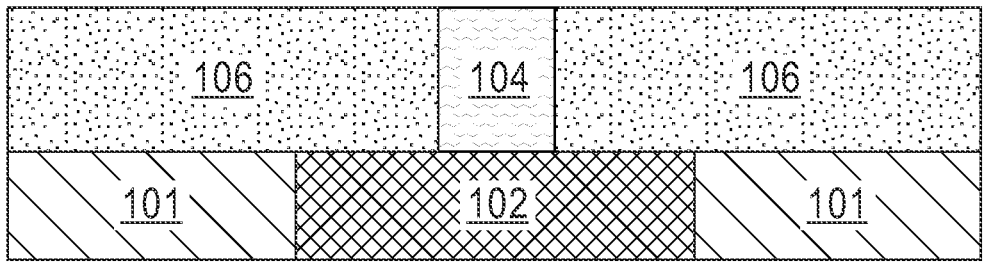
FIG. 1 is a cross-sectional view of a structure after forming a via on a metal layer in accordance with an embodiment of the present invention.

Magnetoresistive random-access memory ("MRAM") devices using magnetic tunnel junctions ("MTJ") are one option to replace existing embedded DRAM technologies. MRAM is a non-volatile memory. Embodiments of the present invention recognize that current MRAM MTJ structures are relatively slow, and the only way to reach MTJ write target speeds comparable to embedded DRAM (~5 ns) are with double magnetic tunnel junctions ("DMTJ"). DMTJ devices generally reduce the write current by a factor of two.

Embodiments of the present invention recognize in some DMTJ devices, a modified DMTJ device with a wide-base is used to increase the MTJ's switching efficiency by eliminating both the resistance area ("RA") penalty and magnetoresistance ("MR") penalty that are both associated with standard DMTJs that have top and bottom MTJ stacks with similar critical-dimensions ("CD"). Embodiments of the present invention recognize that the modified DMTJ with a wide-base is created using a bottom MTJ stack that is wider than the top MTJ stack. Embodiments of the present invention recognize that modified DMTJ devices with a bottom MTJ stack that is wider than the top MTJ stack provide double spin-current sourcing ("DSTT") benefits. In the wide-based, modified DMTJ devices, the bottom barrier layer can have a relatively high RA. The modified DMTJ devices with wide-bases leverage spin-diffusion transport in the non-magnetic ("NM") metal layer and can achieve a reduction in the charge current density through the bottom barrier layer. The bottom NM layer may also serve as an additional boron drain conduit during the annealing processes. In some modified DMTJ devices with wide-bases, a non-magnetic spin conductor is used between the two MTJ stacks (e.g., Cu, CuN, Ag, AgSn, etc.). During the manufacture of these modified DMTJ devices, an in-situ stack deposition process is desired for stack integrity and to avoid an unexpected loss of spin conductance which may happen in an ex-situ process such as oxidation or CMP.

Embodiments of the present invention recognize that during patterning and etching of the bottom layers of a wide-base modified DMTJ device various problems can arise. Embodiments of the present invention recognize that during patterning and etching of the wide-base modified DMTJ device, spacer erosion can occur decreasing the bottom MTJ stack width. Embodiments of the present invention recognize that the typical spacer materials, such as SiN, used in forming a spacer on the wide-base modified DMTJ can be eroded during etch processes used to form the wide-base modified DMTJ resulting in a decrease in the width of the bottom MTJ stack. When the width of the bottom MTJ stack width decreases, the CD of the bottom MTJ stack is decreased, which negatively affects switching efficiency by increasing both the resistance area ("RA") penalty and magnetoresistance ("MR"). Furthermore, embodiments of the present invention recognize that in some cases, the erosion of spacer is uneven due to variations in the microstructure and/or composition of the SiN spacer, resulting in the bottom MTJ stack with an uneven or asymmetrical shape that negatively affects the performance of the wide-base modified DMTJ device.

Embodiments of the present invention recognize that during the etching processes used to form the wide-base modified DMTJ device, small portions of the spin conduction layer sidewall can be attacked or removed due to spacer erosion. Inadvertent etching or unintended removal of pieces of the spin conduction layer results in inefficient spin conduction. Additionally, embodiments of the present invention recognize that in some cases, extrusions of copper or copper-nickel from the spin conduction layer may occur when the spin conduction layer is not adequately protected by the spacer during etch processes. These extrusions into other layers in the back end of the line (BEOL) potentially reduce BEOL reliability. For these reasons, embodiments of the present invention recognize that providing better protection to the spin conduction layer and the bottom MTJ stack during wide non-magnetic base modified DMTJ formation is desirable. Embodiments of the present invention recognize that new semiconductor structures with new spacer materials that provide better protection to the bottom MTJ stack and spin conduction layer would be beneficial to wide non-magnetic base modified DMTJ performance.

Embodiments of the present invention provide a semiconductor structure and a method of forming the semiconductor structure that protects the bottom MTJ stack and the spin conduction layer during etch processes by adding a second spacer composed of a material capable of protecting the bottom MTJ stack and the spin conduction layer during etching processes. Embodiments of the present invention provide the second spacer composed of a material more resistant to IBE or RIE etching processes. Embodiments of the present invention form the second spacer over the first spacer. The first spacer can be composed of a conventional spacer material like SiN. In general, embodiments of the present invention provide a second spacer that has a lower etch rate than the material of the first spacer. Embodiments of the present invention use a second spacer composed of a metal material or metal compound material with a high atomic number metal.

The second spacer is deposited and formed over the first spacer and provides additional protection to the bottom MTJ stack and spin conduction layer in embodiments of the present invention. The second spacer prevents or reduces the erosion of the first spacer, the bottom MTJ stack, and the spin conduction layer. In doing so, the addition of the second spacer maintains the CD bottom MTJ stack in the wide non-magnetic base modified DMTJ. Creating and maintaining the wider CD of the bottom MTJ stack with respect to the top MTJ stack reduces or eliminates the resistance area ("RA") penalty and magnetoresistance ("MR") penalty occurring in DMTJs with the same size top and bottom MTJ. Embodiments of the present invention include the materials and the method of forming the second spacer on the wide-base modified DMTJ device.

Detailed embodiments of the claimed structures and methods are disclosed herein. The structures depicted and disclosed herein are back-end of the line semiconductor structures in a semiconductor chip. The method steps described below do not form a complete process flow for manufacturing integrated circuits, such as semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of an MRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Implementation of embodiments of the invention may take a variety of forms, and exemplary implementation details are discussed subsequently with reference to the Figures. The present invention will now be described in detail with reference to the Figures.

FIG. 1 is a cross-sectional view of structure 100 after forming via 104 on Mx 102 in accordance with an embodiment of the present invention. As depicted, FIG. 1 includes dielectric 101, Mx 102, via 104, and via dielectric 106. Mx 102 is a metal layer above a semiconductor substrate (not depicted). Mx 102 can be a metal layer in a middle of the line (MOL) or a metal layer in the BEOL. For example, Mx 102 can be a portion of M2 or M3 metal layers, such as a line, or a contact in the M2 metal layer or the M3 metal layer.

Mx 102 may be composed of but, is not limited to Cu, TaN, Ta, Ti, TiN, or a combination thereof. As depicted, dielectric 101 surrounds Mx 102. Dielectric 101 may be composed of a dielectric material such as but, not limited to SiOx, SiNx, SiBCN, a low-κ dielectric material, a nitrogen-doped barrier low-k material (NBLOK), or any other suitable dielectric material. Mx 102 and dielectric 101 may be deposited and formed using known metal and dielectric material deposition, planarization (optional), and etch processes for semiconductor manufacture.

Via dielectric 106 is deposited over dielectric 101 and Mx 102. Via dielectric 106 can be the same or a different dielectric material than the dielectric material of dielectric 101. Via dielectric 106 can be patterned with known photolithography and etched, for example, using an RIE process to form a via 104. A metal layer is deposited over via dielectric 106 and exposed portions of Mx 102. One or more of a CVD process, a PVD process, and ALD process, may be used to deposit the metal layer. The metal layer forming via 104 can be composed of one or more of tungsten (W), copper (Cu), tantalum nitride (TaN), Ta, titanium (Ti), TiN, TiOCN, or TaON.

After the metal deposition, a CMP may be performed to planarize the surface of structure 100 and form via 104. The CMP removes excess metal above the top surface of via dielectric 106. As depicted in FIG. 1, a portion of the deposited metal, such as W remains in via dielectric 106 to form via 104.

Figure 2:
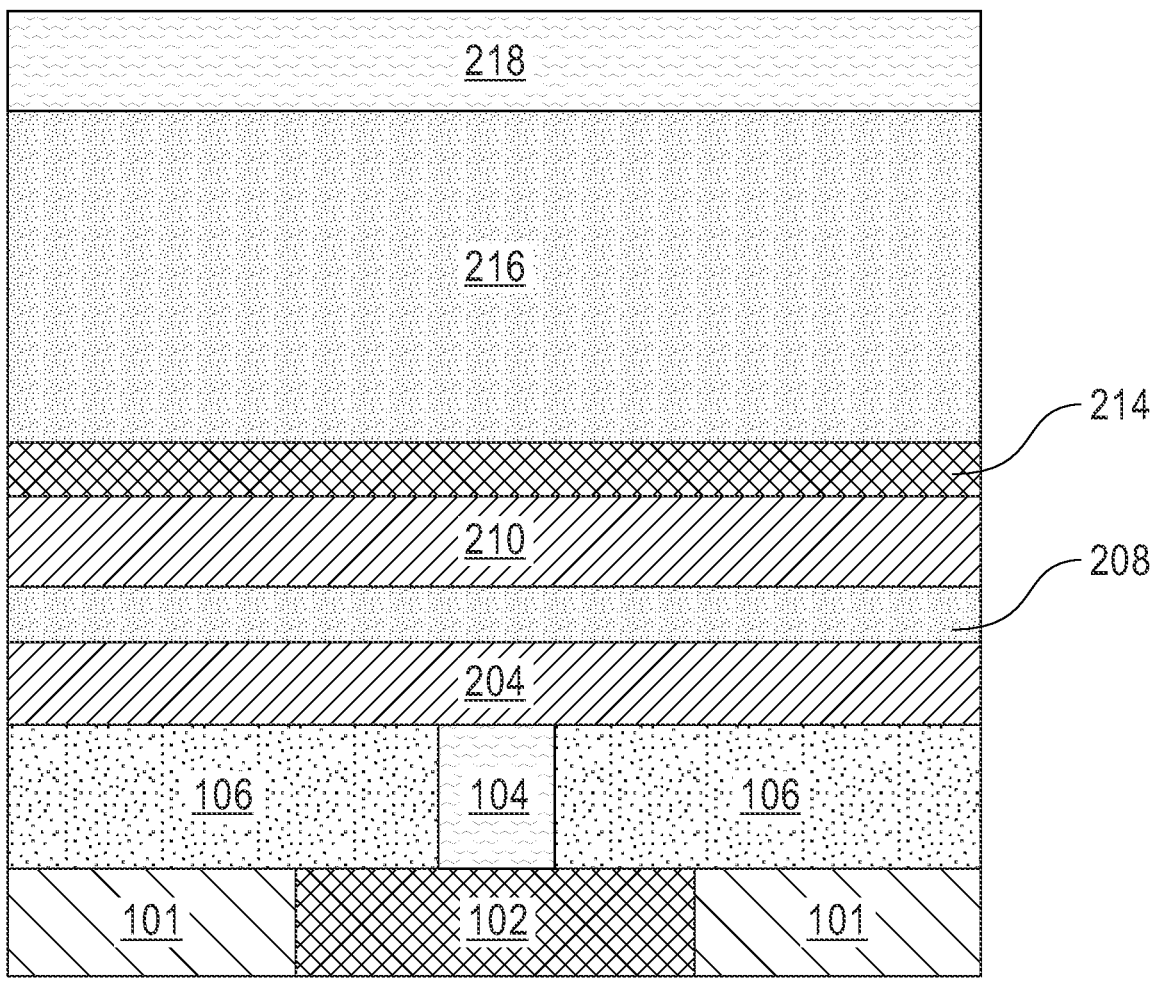
FIG. 2 is a cross-sectional view of the structure after depositing a stack of material layers for a double MTJ in accordance with an embodiment of the present invention.

FIG. 2 is a cross-sectional view of structure 200 after depositing a stack of material layers for a double MTJ in accordance with an embodiment of the present invention. As depicted, FIG. 2 includes the elements of FIG. 1 and the stack of material layers for the double MTJ that is composed of bottom MTJ stack 204, spin conduction layer (SCL) 208, top MTJ stack 210, etch stop 214, hardmask (HM) 216, and dielectric/organic hardmask (HM) 218. As known to one skilled in the art, more layers, less layers, or different layers of materials may compose the stack of material layers for the double MTJ in other embodiments. In some embodiments, dielectric/organic HM 218 is an organic mask or a photoresist. In some embodiments, a cap layer may be deposited over top MTJ stack 210. Using conventional MRAM materials and deposition processes, each layer of the stack of material layers is sequentially deposited starting with bottom MTJ stack 204, followed by SCL 208, then, top MTJ stack 210, etch stop 214, HM 216, and dielectric/organic HM 218 in structure 200. For example, each layer of the stack of material layers may be deposited by ALD, PECVD, PVD, or another suitable deposition process.

In various embodiments, bottom MTJ stack 204 and top MTJ stack 210 each include a reference layer, a first tunnel barrier layer, a first free layer, a metal spacer layer, a second free layer, and a second tunnel barrier layer. In general, with regard to the MTJ stacks (i.e., bottom MTJ stack 204 and top MTJ stack 210), information is stored in the magnetic orientation of a free layer film (described in further detail herein) in relation to that of the reference layer. The reference layer may be a single layer or a plurality of layers. In an embodiment, the reference layer of the MTJ stack is a synthetic antiferromagnetic ("SAF") layer. In some embodiments, the reference layer of the MTJ stack includes a plurality of sublayers (e.g., twenty or more sublayers).

In the formation of either of the MTJ stacks, a first tunnel barrier layer is formed on top of the reference layer. In an embodiment, the first tunnel barrier layer is a barrier, such as a thin insulating layer between two electrically conducting materials. Electrons (or quasiparticles) pass through the tunnel barrier by the process of quantum tunneling. In various embodiments, the first tunnel barrier layer includes at least one sublayer composed of MgO or another suitable tunnel barrier material.

The free layer is a magnetic free layer that is adjacent to the first tunnel barrier layer to be opposite the reference layer. The magnetic free layer has a magnetic moment or magnetization that can be flipped. The second tunnel barrier layer is formed on the free layer. In some embodiments, the second tunnel barrier includes an outermost sublayer (or some other sublayer) comprised of the same material (e.g., MgO) as the first tunnel barrier layer.

As known to one skilled in the art, in either of bottom MTJ stack 204 or top MTJ stack 210, each of the layers may include any number of sublayers, may include additional layers, and/or may omit some layers in other examples. Moreover, the composition of layers and/or sublayers may be different between bottom MTJ stack 204 and top MTJ stack 210. In some embodiments, bottom MTJ stack 204 and top MTJ stack 210 are formed by a self-aligned patterning process.

As depicted in FIG. 1, etch stop 214 is formed on top MTJ stack 210. Etch stop 214 can be composed of but is not limited to ruthenium (Ru). In some embodiments, a cap layer (not shown) is formed between top MTJ stack 210 and etch stop 214.

HM 216 can be formed on etch stop 214 using a metallic hardmask material. For example, HM 216 may be composed of W, TaN or TiN but is not limited to these materials. The metal materials of HM 216 can be any suitable top electrode metal used in MRAM devices. Dielectric/organic HM 218 can be formed on HM 216. Organic/dielectric HM 218 may be composed of an organic planarization layer ("OPL") material, a photoresist material, SiNx, or SiOx where x denotes the number of nitrogen or oxygen or atoms respectively.

Figure 3:
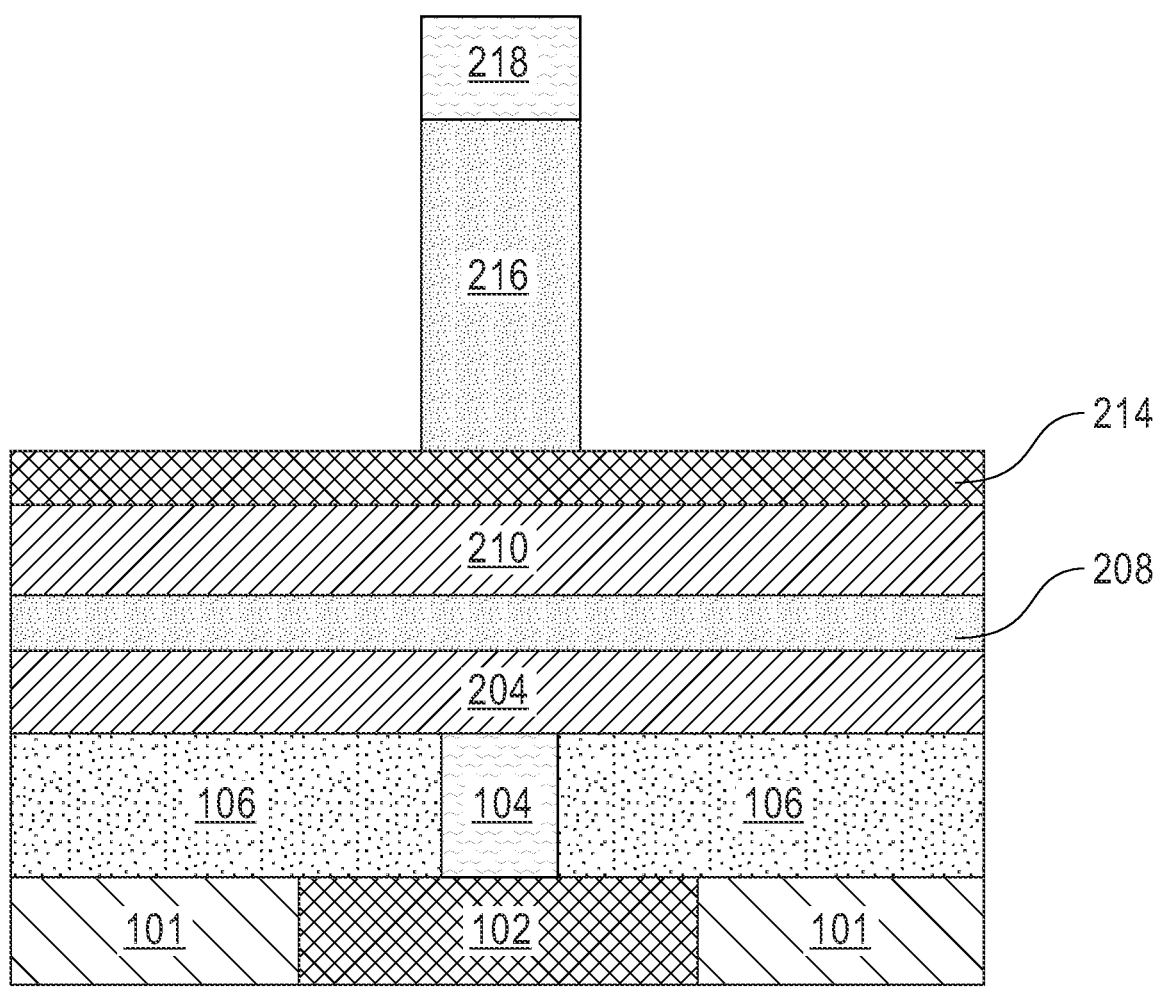
FIG. 3 is a cross-sectional view of the structure after etching hardmask layers of the stack of material layers in accordance with an embodiment of the present invention.

FIG. 3 is a cross-sectional view of structure 300 after etching HM 216 and dielectric/organic HM 218 in accordance with an embodiment of the present invention. HM 216 and dielectric/organic HM 218 may be patterned by lithography and etched using RIE, for example. As depicted, HM 216 and dielectric/organic HM 218 are etched forming a pillar of HM 216 and dielectric/organic dielectric/organic HM 218. The width of the pillar formed with the remaining HM 216 and dielectric/organic HM 218 can range from 10 to 500 nm but is not limited to this range.

Figure 4:
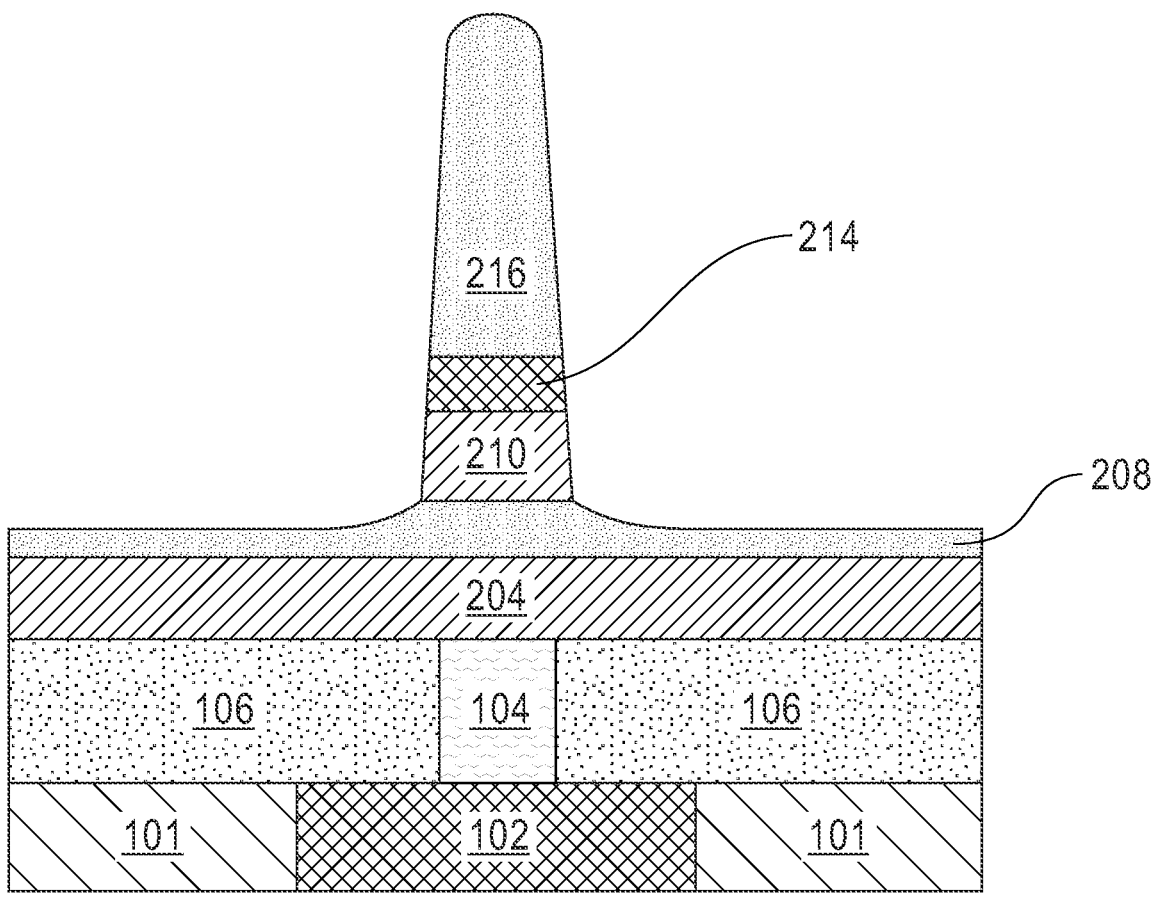
FIG. 4 is a cross-sectional view of the structure after removing a portion of the stack of material layers to form a top MTJ in accordance with an embodiment of the present invention.

FIG. 4 is a cross-sectional view of structure 400 after removing a portion of the stack of material layers to form top MTJ stack 210 in accordance with an embodiment of the present invention. As depicted, FIG. 4 includes the elements of FIG. 3 after removing dielectric/organic HM 218 and a portion of each of SCL 208, top electrode stack 210, etch stop 214, and HM 216.

Using an IBE, an RIE, or a combination of IBE and RIE, a portion of each of etch stop 214, top stack 210, and SCL 208 may be removed. In some embodiments, dielectric/organic HM 218 is a resist material or an OPL over HM 216 that is removed after etching. The etching of etch stop 214, top MTJ stack 210, and SCL 208 can extend into a top portion of SCL 208. As depicted in FIG. 4, the etch process is stopped near the top of SCL 208. As shown in FIG. 4, a portion of the top surface of SCL 208 is curved or has a curved cross-sectional profile near where SCL 208 abuts top MTJ stack 210. In some embodiments, the etch process using an IBE and/or RIE, stops at the top surface of SCL 208 and leaves the vertical sides of top MTJ stack 210 exposed. In these embodiments, by changing the etch parameters (e.g., etch angle, etch time, etch energy, etc.), the top surface of SCL 208 around top MTJ stack 210 is flat rather than the curved surface depicted in FIG. 4.

At this stage in the manufacturing process, as depicted in FIG. 4, the critical dimension (CD) of top MTJ stack 210 is less than that of bottom MTJ stack 204. Moreover, the CD of the SCL 208 gradually changes throughout the thickness of the layer of SCL 208. A layer of SCL 208 remains on the top of bottom MTJ stack 204.

FIG. 4 depicts a tapered shape for the combination of HM 216, etch stop 214, and top MTJ stack 210 with a fairly consistent slope (i.e., at least substantially until reaching SCL 208). However, it should be appreciated that in other embodiments, the sides or sidewalls of HM 216, etch stop 214, and top MTJ stack 210 have a vertical (or nearly vertical) profile. The slope or angle of the sidewalls of HM 216, etch stop 214 and top MTJ stack 210 with respect to the horizontal surface or bottom MTJ stack 204 or to surface of the semiconductor substrate (not depicted) may vary from 70 to 90 degrees but is not limited to these angles or this slope.

After patterning the top MTJ stack 210, an optional process, such as a controlled in-situ oxidation or air-break may occur. Controlled in-situ oxidation can be a process exposing the wafer (e.g., structure 400) to a fixed oxygen pressure, for example between 1 m Torr and 500 Torr. Air-break is an ex-situ process where the wafers are taken out of the etching chamber and exposed to air. Controlled in-situ oxidation and air-break may reduce partial short failures of MRAM cell which are associated to the metallic re-deposition around the perimeter of the top tunneling barrier.

Figure 5:
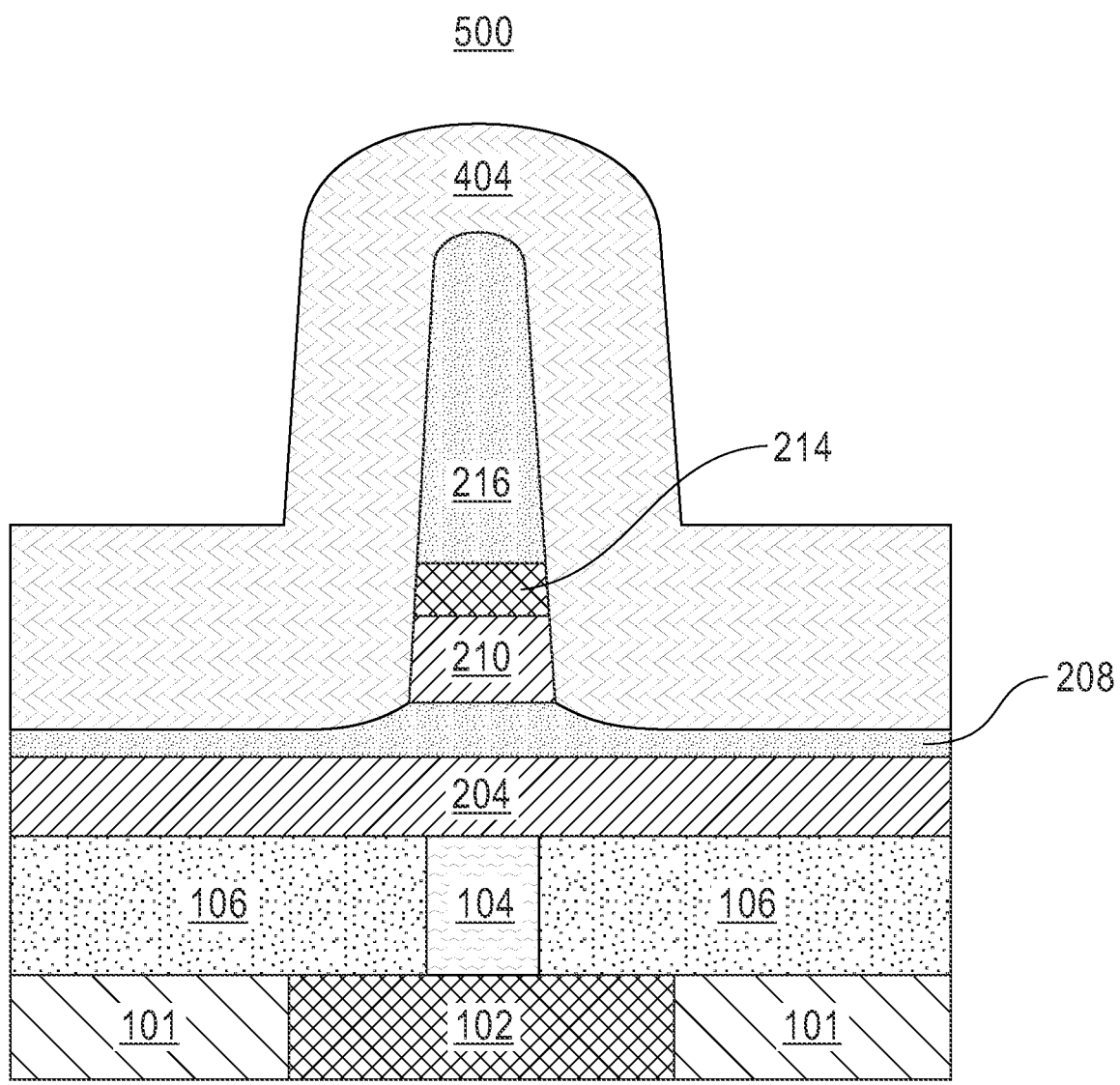
FIG. 5 is a cross-sectional view of the structure after depositing a first spacer over the top surface of the semiconductor structure in accordance with an embodiment of the present invention.

FIG. 5 is a cross-sectional view of structure 500 after depositing first spacer 404 over the top surface of structure 500 in accordance with an embodiment of the present invention. As depicted, FIG. 5 includes the elements of FIG. 4 and first spacer 404. An optional plasma process pretreatment may be used before first spacer 404 deposition. For example, a plasma pretreatment is performed using one or more of an oxygen, hydrogen, nitrogen, or combination of these elements (i.e., NH$_3$) in a plasma. First spacer 404 can be deposited by but not limited to PVD, ALD, or PECVD. First spacer 404 may be composed of but not limited to SiN, an oxide of Si, Ti, or Ali (i.e., SiOx, TiOx, or ALOx), boron nitride (BN), or SiBCN.

Figure 6:
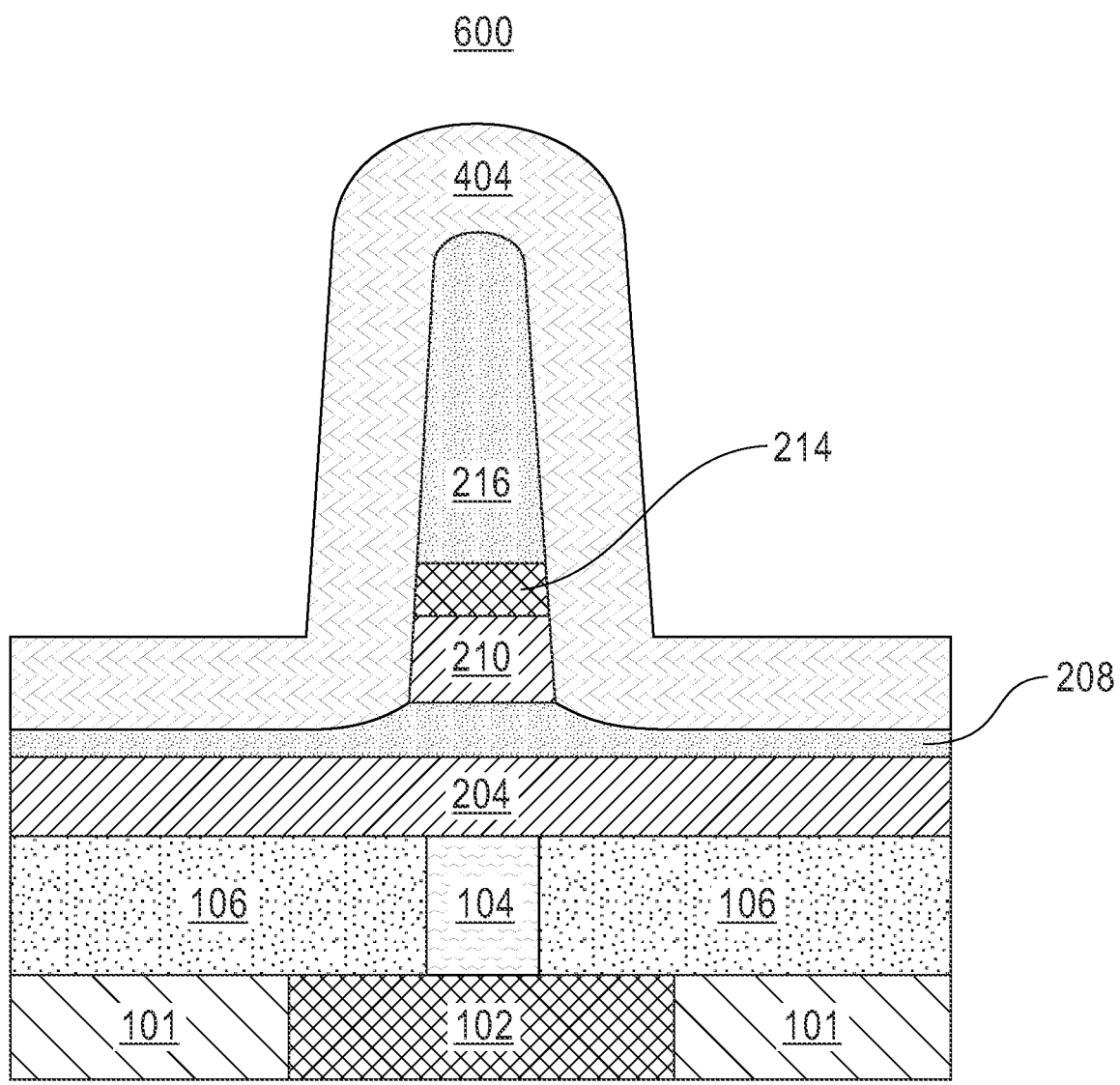
FIG. 6 is a cross-sectional view of the structure after removing a top portion of the first spacer in accordance with an embodiment of the present invention.

FIG. 6 is a cross-sectional view of structure 600 after removing a top portion of first spacer 404 in accordance with an embodiment of the present invention. As depicted, FIG. 6 includes the elements of FIG. 5 after a partial etch of first spacer 404. Using for example, a low angle IBE, an RIE, or a combination of a low angle IBE and RIE, a portion of first spacer 404 is removed around the angled sides of HM 216, from a top surface of first spacer 404 above the top of HM 216, and from the top surface first spacer 404 above and on SCL 208. As depicted, after the partial etch using low angle IBE and/or RIE, a layer of first spacer 404 remains over SCL 208 and around top MTJ stack 210, etch stop 214, around and on HM 216. The thickness of first spacer 404 after the partial etch can range from 5 to 100 nm but is not limited to this range.

Figure 7:
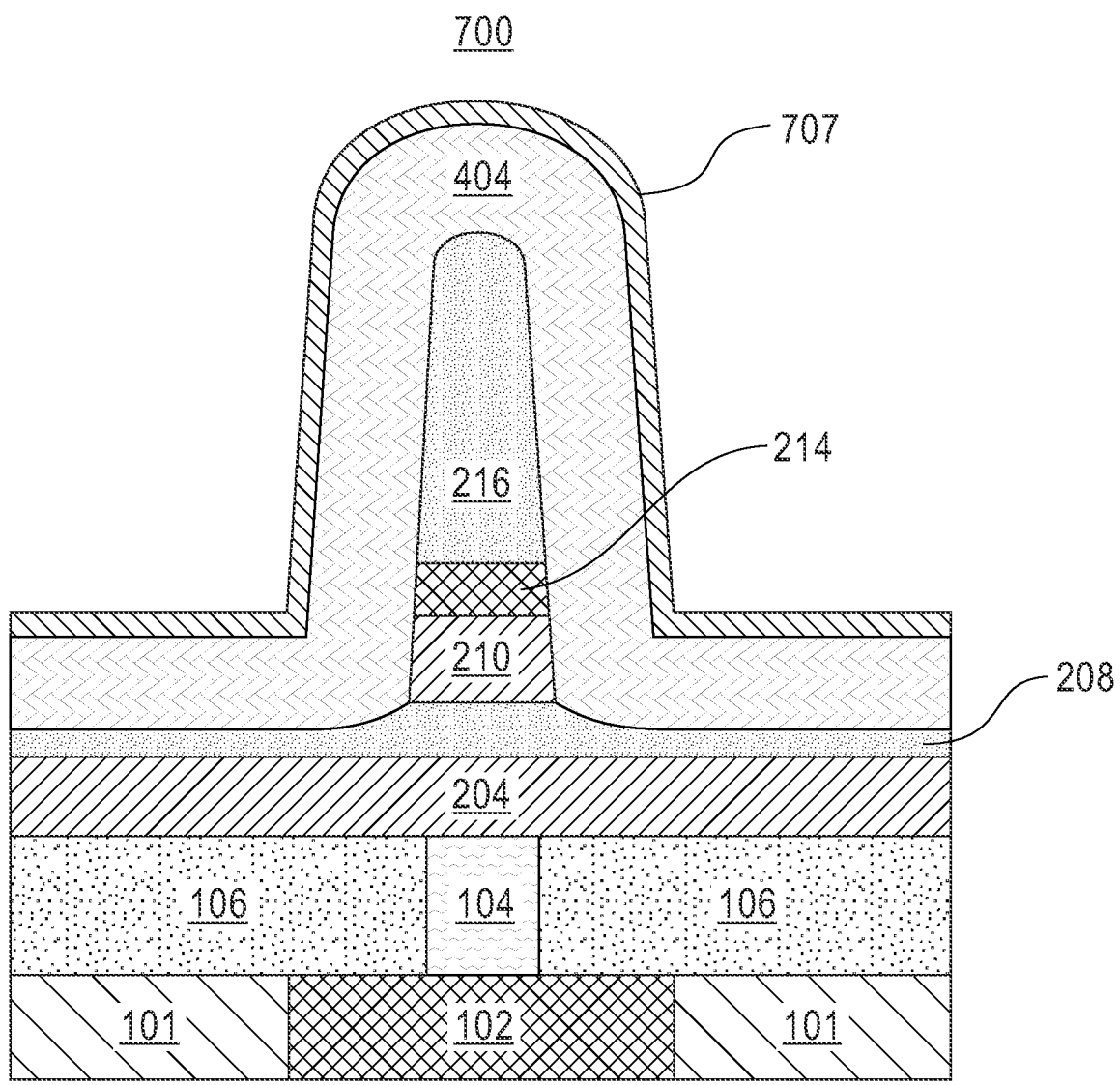
FIG. 7 is a cross-sectional view of the structure after depositing a second spacer on the first spacer in accordance with an embodiment of the present invention.

FIG. 7 is a cross-sectional view of structure 700 after depositing a second spacer 707 on the remaining portion of the first spacer 404 in accordance with an embodiment of the present invention. In various embodiments, second spacer 707 is composed of a material with a lower etch rate than the material of first spacer 404 in low angle IBE or RIE. Second spacer 707 can be composed of one or more high atomic number metals, such as but not limited to Ta, palladium (Pd), metal compounds containing a high atomic number metal such as TaN, or hard materials such as diamond (carbon). Second spacer 707 which is over first spacer 404 provides additional protection for SCL 208 and bottom MTJ stack 204 during later etch processes. In this way, second spacer 707 prevents reduction of the diameter of bottom MTJ stack 204, asymmetry in bottom MTJ stack 204, for example, when first spacer 404 etching is uneven due to microstructure or composition changes in first spacer 404. Uneven etching of SCL 208 where portions of SCL 208 can be attacked or removed results in spin conduction inefficiency. A layer of second spacer 707 can be deposited on first spacer 404 using ALD or PECVD but is not limited to these deposition processes. The thickness of second spacer 707 can range from 5 to 30 nm but is not limited to this range.

Figure 8:
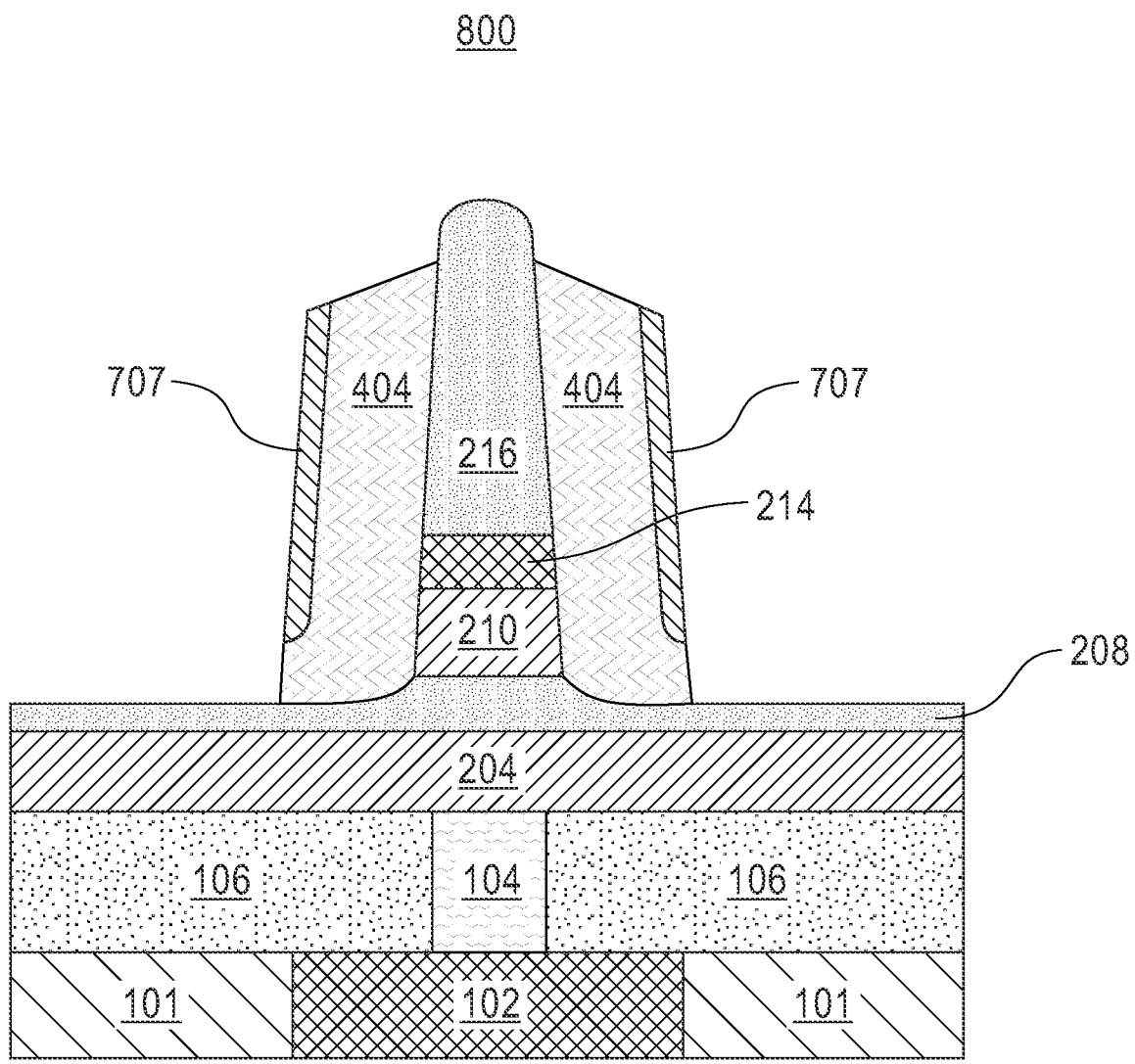
FIG. 8 is a cross-sectional view of the structure after removing horizontal portions of the first and second spacer in accordance with an embodiment of the present invention.

FIG. 8 is a cross-sectional view of structure 800 after removing horizontal portions of second spacer 707 and first spacer 404 in accordance with an embodiment of the present invention. In various embodiments, using one or more of a low angle IBE process and/or an RIE process, the horizontal portions of second spacer 707 and first spacer 404 are removed over portions of the horizontal top surface of SCL 208. In some embodiments, a combination of an IBE and RIE is used to remove horizontal portions of second spacer 707 and first spacer 404.

As depicted, the sides or sidewalls of second spacer 707 and first spacer 404 are sloped and are essentially or nearly parallel to the sidewalls of HM 216, etch stop 214, and top MTJ stack 210. After removing horizontal portions of second spacer 707, a small horizontal portion of first spacer 404 remains under the bottom of second spacer 707. The small horizontal portion of first spacer 404 is abutting a top portion of SCL 208. Second spacer 707 is separated from horizontal or curved surfaces of SCL 208 by first spacer 404 (e.g., to prevent shorting). As depicted, the top portion of HM 216 is exposed after etching. The cone-like shape or angle of the top surfaces of second spacer 707 and first spacer 404 may vary depending on the etching processes and etching process parameters used. In some cases, a divot or dip in the top surface of first spacer 404 can occur (not depicted). As depicted in FIG. 8, first spacer 404 and second spacer 707 cover the sides of top MTJ stack 210, etch stop 214, most of HM 216, the curved portion of SCL 208, and in some cases, a small horizontal top surface of SCL 208 adjacent to the curved portion of SCL 208.

Figure 9:
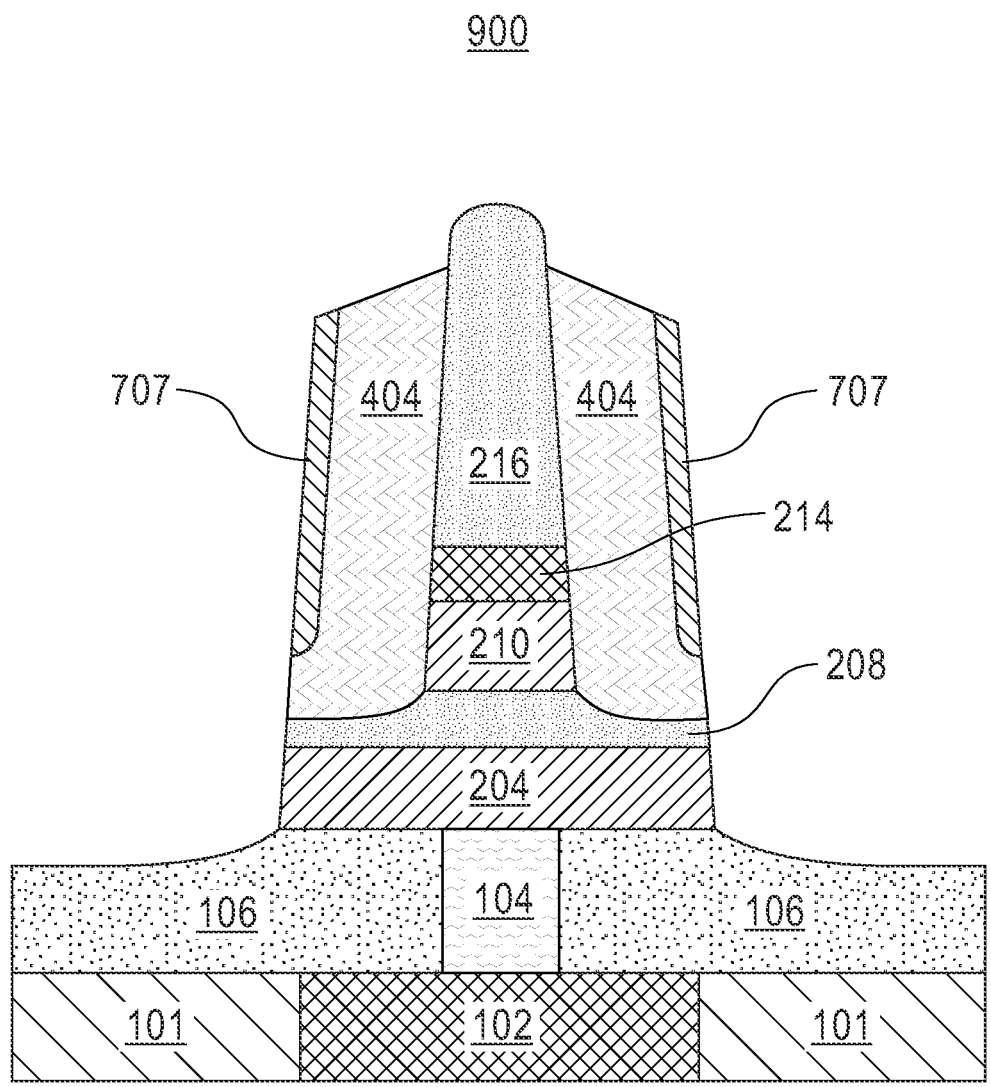
FIG. 9 is a cross-sectional view of the structure after etching portions of the bottom MTJ and the via dielectric material in accordance with an embodiment of the present invention.

FIG. 9 is a cross-sectional view of structure 900 after another etching process removing portions of the bottom MTJ stack 204 and a portion of via dielectric 106 in accordance with an embodiment of the present invention. As depicted, FIG. 9 includes the elements of FIG. 8 with some top portions of SCL 208 that are not covered by the remaining portions of first spacer 404 are removed, the portions of bottom MTJ stack 204 under the removed portions of SCL 208 are also removed, and a top portion of via dielectric 106 adjacent to the remaining bottom edge of bottom MTJ stack 204 can also be removed.

In various embodiments, structure 900 is formed using one or both of a low angle IBE or an RIE process to remove exposed portions of SCL 208, portions of bottom MTJ stack 204, and a top portion of via dielectric 106 that are not under first spacer 404. After the etch process, structure 900 includes a cone-shaped pillar of HM 216 at the top of the pillar with etch stop 214 under HM 216, top MTJ stack 210 under etch stop 214, the remaining portion of SCL 208 under first spacer 404 and top MTJ stack 210, and the remaining bottom MTJ stack 204 under the remaining portion of SCL 208. First spacer 404 covers the sides and curved top surface of SCL 208, the sides of each of top MTJ stack 210, etch stop 214, and HM 216. Second spacer 707 covers the sidewall of first spacer 404. After etching, a layer of second spacer 707 covers a portion of the sides of first spacer 404 and is separated from the curved edge portions of SCL 208 by first spacer 404. As depicted in FIG. 9, bottom MTJ stack 204 is larger than top MTJ 210.

In various embodiments, structure 900 is formed using one of or a combination of a low angle IBE or an RIE process to remove exposed portions of SCL 208, portions of bottom MTJ stack 204, and a top portion of via dielectric 106 that are not under first spacer 404. After the etching process, structure 900 includes a cone-shaped pillar of HM 216 at the top of the pillar with etch stop 214 under HM 216, top MTJ stack 210 under etch stop 214, the remaining portion of SCL 208 under first spacer 404 and top MTJ stack 210, and the remaining bottom MTJ stack 204 under the remaining portion of SCL 208. First spacer 404 covers the sides and curved top surface of SCL 208, the sides of each of top MTJ stack 210, etch stop 214, and HM 216. Second spacer 707 covers the sidewall of first spacer 404. After etching, a layer of second spacer 707 covers a portion of the sides of first spacer 404 and is separated from the curved edge portions of SCL 208 by first spacer 404.

After the etching process(es), the sidewall of the remaining portion of bottom MTJ stack 204 and the outer sidewall of the portion of the curved top surface of SCL 208 are parallel to the sidewall or outside surfaces of second spacer 707 and the bottom sidewall of first spacer 404 and form a cone-shaped pillar (e.g., an MRAM pillar with a DMTJ).

As depicted in FIG. 9, the top surface of each of HM 216, etch stop 214, top MTJ stack 210, SCL 208, and bottom MTJ stack 204 is smaller than the bottom surface of each of the layers (e.g., the top of bottom MTJ stack 204 is smaller than the bottom of bottom MTJ stack 204). The amount of the difference between the top of the layer and the bottom of each layer can vary depending on the various etch process parameters (e.g., the IBE etch angle or etch time affects the slope of the sides of the cone-shaped pillar). For example, the sides of the cone-shaped may be vertical or nearly vertical or in other examples, may form an 80-degree angle with respect to the horizontal top surface of the semiconductor substrate (not depicted).

As previously mentioned, the cone-shaped pillar in FIG. 9 may also be known as an MRAM pillar, which in this example, is composed of two MTJs (i.e., bottom MTJ stack 210 and top MTJ stack 204), SCL 208, etch stop 214, HM 216 with the sidewall of most of the MRAM pillar covered by first spacer 404 and second spacer 707 over and protecting first spacer 404. As previously discussed above, the angle of the sides of the cone-shaped pillar may vary in other examples. As depicted in FIG. 9, the sides or sidewall of the cone-shaped pillar or MRAM pillar, include a small portion of HM 216, portions of first spacer 404, a top and sides of second spacer 707, a thin portion of the side of SCL 208, and the sides or sidewall of bottom MTJ stack 204. Using the methods discussed with respect to FIGS. 1-9 to form structure 900, bottom MTJ stack 204 is wider than top MTJ stack 210. During the etch processes as discussed with respect to FIG. 9, bottom MTJ stack 210 remains protected under second spacer 707 and first spacer 404. In particular, second spacer 707 with formed with an IBE/RIE etch resistant material like TaN can protect both first spacer 404 and bottom MTJ stack 210. Using an etch resistant material for second spacer 707 preserves the width or critical diameter of the bottom MTJ stack 210. By using a material for second spacer 707 that can be IBE/RIE etch resistant or slow to etch in IBE or RIE protects the CD of bottom MTJ stack 210. Using an etch resistant for second spacer 707 aides in maintaining a symmetrical and wider bottom MTJ stack 210 that enables the funneling of more spin to the top free layer. Additionally, second spacer 707 can protect SCL 208 from attack and/or from forming extrusions during the IBE and/or RIE processes. Protecting SCL 208 from inadvertent etching or attack maintains efficient spin conduction. As previously discussed, preventing SCL 208 extrusions improves BEOL reliability.

After patterning bottom MTJ stack 204, an optional process, such a controlled in-situ oxidation or air-break may occur. Controlled in-situ oxidation can be a process exposing the wafer (e.g., structure 900) to a fixed oxygen pressure, for example between 1 m Torr and 500 Torr. Air-break is an ex-situ process where the wafers are taken out of the etching chamber and exposed to air. Controlled in-situ oxidation and air-break may reduce partial short failures of MRAM cell which are associated to the metallic re-deposition around the perimeter of the top tunneling barrier.

Figure 10:
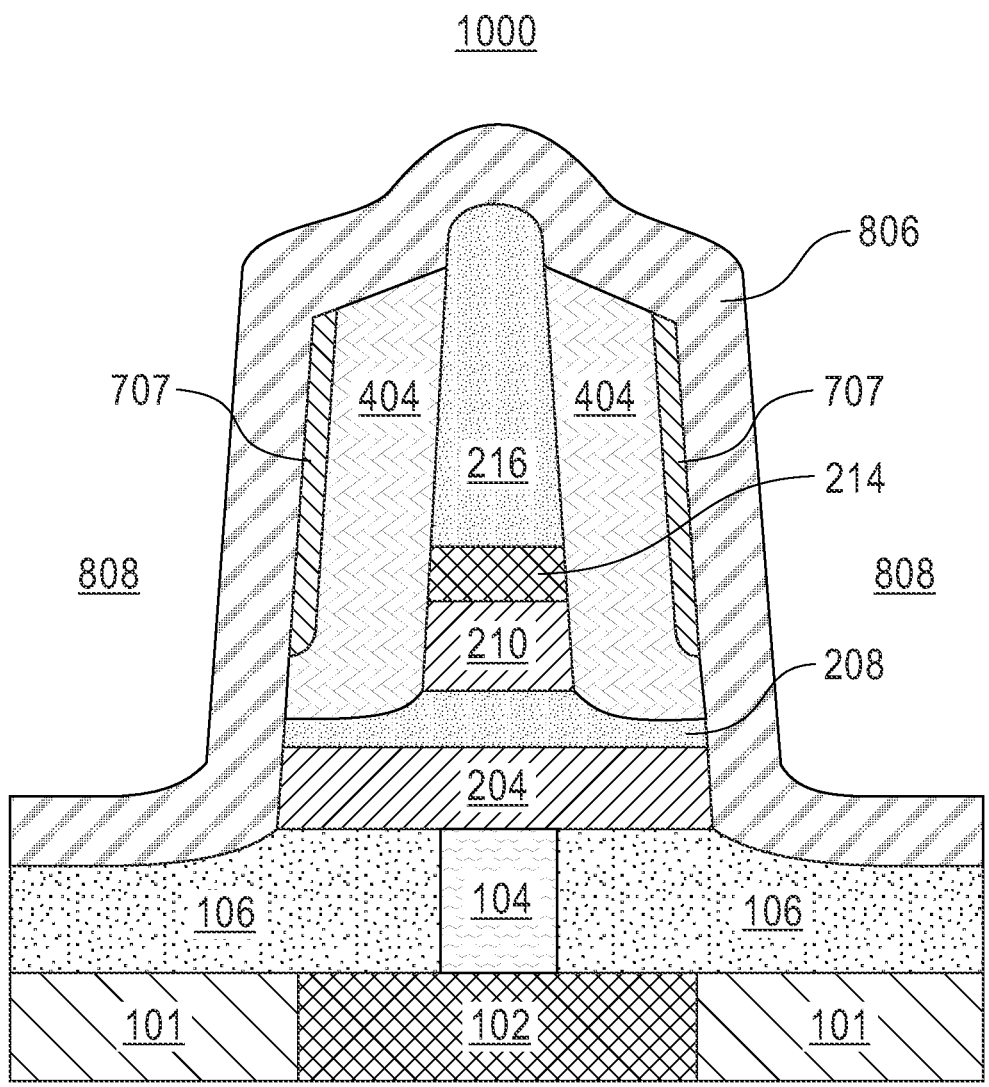
FIG. 10 is a cross-sectional view of the structure after depositing an encapsulation dielectric layer over the semiconductor structure in accordance with an embodiment of the present invention.

FIG. 10 is a cross-sectional view of structure 1000 after depositing an encapsulation dielectric 806 over structure 1000 in accordance with an embodiment of the present invention. As depicted, FIG. 10 includes the elements of FIG. 9 and encapsulation dielectric 806 and interlayer dielectric (ILD) 808. Encapsulation dielectric 806 can be deposited by but not limited to PVD, ALD, or PECVD. Encapsulation dielectric 806 may be composed of but not limited to ALOx, TiOx, SiOx, BN, SIN, or SiBCN. An optional plasma process pretreatment may be used before first spacer 404 deposition. For example, plasma pretreatment may be performed using one or more of an oxygen, hydrogen, or nitrogen plasma, or combination of these elements (i.e., $NH_3$) in a plasma. Encapsulation dielectric 806 can be deposited on exposed surfaces of via dielectric 106, bottom MTJ stack 204, SCL 208, first spacer 404, the sides and top of second spacer 707, and HM 216. After encapsulation dielectric 806 deposition, a layer of ILD 808 is deposited over encapsulation dielectric 806 and fills the area or trench adjacent to the MRAM pillar. ILD 808 extends above HM 216 in the cone-shaped pillar in various embodiments.

Figure 11:
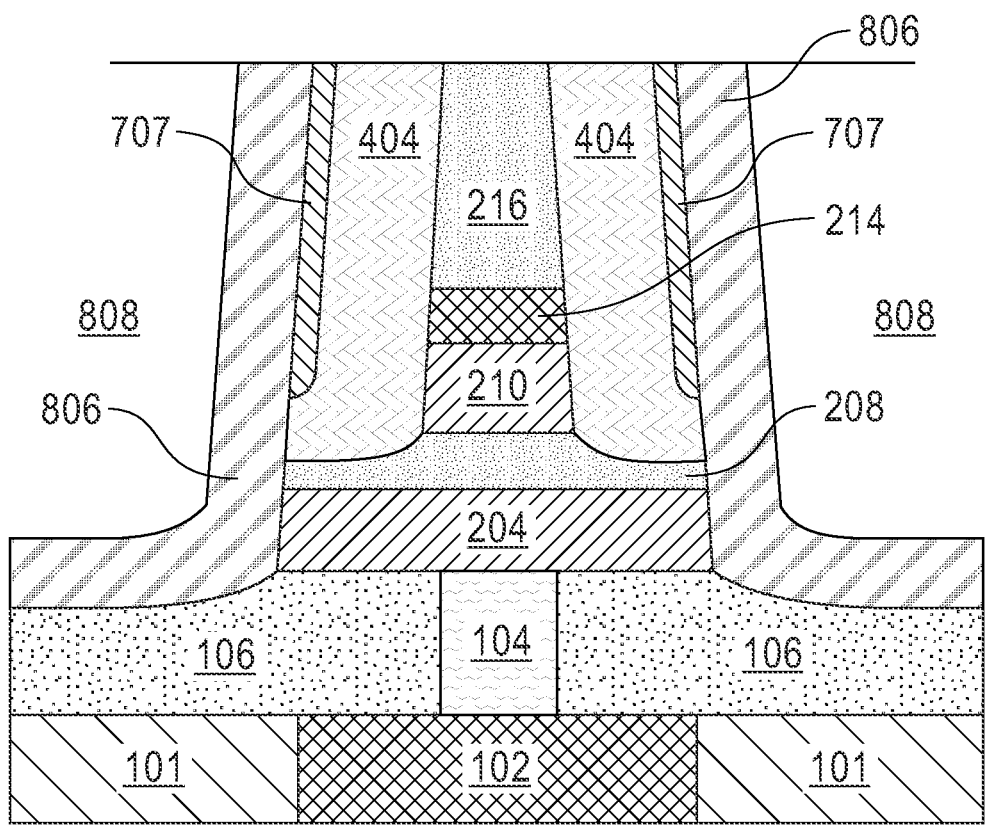
FIG. 11 is a cross-sectional view of the structure after a chemical-mechanical polish (CMP) in accordance with an embodiment of the present invention.

FIG. 11 is a cross-section of structure 1100 after a CMP in accordance with an embodiment of the present invention. The CMP planarizes the top surface of structure 1100 by removing the top portions of ILD 808, encapsulation dielectric 806, HM 216, first spacer 404, and second spacer 707. After the CMP, the cone-shaped pillar or MRAM pillar has a flat top. The flat top of the cone-shaped pillar exposes the top portion of HM 216, first spacer 404, second spacer 707, encapsulation dielectric 806, and ILD 808.

Figure 12:
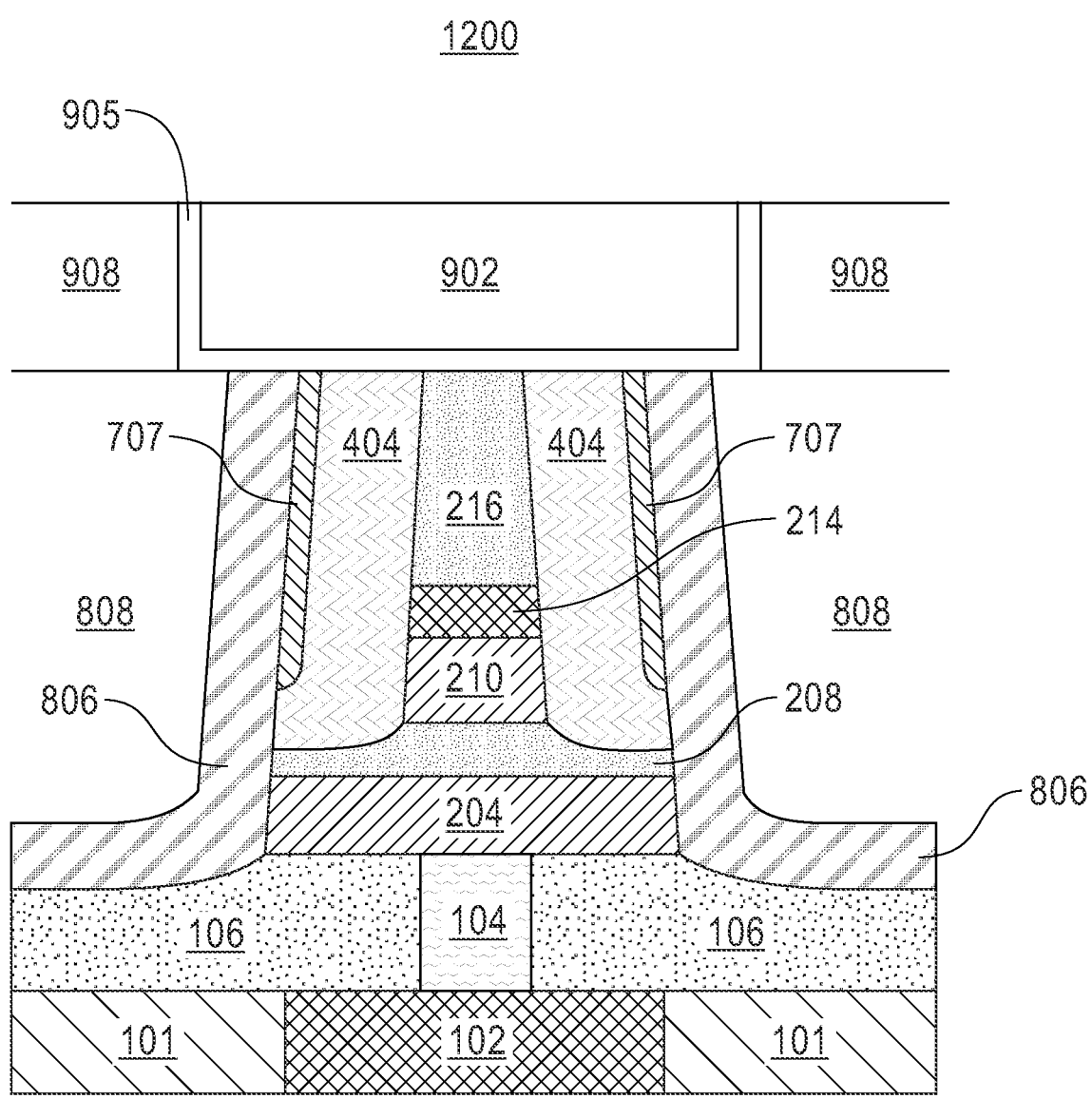
FIG. 12 is a cross-sectional view of the structure after forming a bit-line over the double MTJ in accordance with an embodiment of the present invention.

FIG. 12 is a cross-sectional view of structure 1200 after forming bit-line 902 over the top of the flattened cone-shaped pillar formed by the CMP process in FIG. 10 in accordance with an embodiment of the present invention. As depicted, FIG. 12 includes the elements of FIG. 11 and bit-line 902 with liner 905 surrounded by ILD 908. A layer of ILD 908 is deposited over structure 900 depicted in FIG. 9. ILD 908 can be patterned using photolithography and etched, for example, using RIE or another suitable ILD etch process.

After etching ILD 908, a layer of a liner material, such as but not limited to tantalum-nitrogen alloys, titanium-nitrogen alloys, or tantalum-aluminum-nitrogen alloys can be deposited by known liner deposition processes (e.g., ALD or PECVD). Liner 905 can be deposited over ILD 908 and on exposed top surfaces of HM 216, first spacer 404, second spacer 707, encapsulation dielectric 806, and a portion of ILD 808 adjacent to the top surface of encapsulation dielectric 806. After liner 905 is deposited, a layer of a conductive material or metal for bit-line 902 is deposited over liner 902. The material for bit-line 902 can include but is not limited to Ta, TaN, or Cu. A CMP is performed to remove excess liner 902 and bit-line 902 material from the top surface of ILD 908. After the CMP, bit-line 902 with liner 905 is formed above HM 216 over top MTJ stack 210. Structure 1200 includes bottom MTJ stack 204 with a wider CD than top MTJ stack 210 that is connected by via 104 to Mx 102. The wider bottom MTJ stack 210 and the narrower top MTJ stack 204 are separated by SCL 208 to form a wide-based DMTJ for an MRAM device using a double spacer process. The double spacer process using first spacer 404 composed of a traditional spacer material, such as SiN and a second spacer 707 composed of an etch resistant material, such as TaN. The double spacer process can protect first spacer 404 and each of SCL 208 and bottom MTJ stack 204 using second spacer 707 during the various etching processes used to form the wide-base DMTJ depicted in structure 1200.

In summary, a general description of a method to form the wide-base DMTJ structure with two spacers depicted in FIG. 12 includes the steps as discussed previously in detail with respect to FIGS. 1-12. In other embodiments, one or more variations in the processes, the materials, or an order of the processes is different. The steps include forming via 104 on a metal layer (e.g., Mx 102) in a dielectric material, dielectric 101 and depositing a stack of material layers for a double MTJ on the via and the dielectric material, and then, patterning and selectively etching at least a portion of hardmask 216 in one or more portions of the stack of the material layers for the double MTJ. The method includes using hardmask 216 in the stack of material layers for the double MTJ and one or more of an IBE or an RIE to selectively etch portions of etch stop 214, top MTJ stack 210, and a top portion of SCL 208 in the stack of material layers of the double MTJ stack and depositing a first spacer material for first spacer 404 over and around the remaining portions of hardmask 216, etch stop 214, top MTJ stack 210, and over SCL 208. A partial etch of first spacer 404 may occur. A deposition of second spacer 707 over first spacer 404 occurs. An etch of horizontal portions of second spacer 707 and horizontal portions of first spacer 404 not covered by second spacer 707 occurs. Removing portions of SCL 208, bottom MTJ stack 204, and a top portion of ILD 106 that are not under second spacer 707 and the remaining portion of first spacer 404 occurs using one or more of an IBE or an RIE for the etching process (s). A layer of encapsulation dielectric 806 is deposited on the exposed surfaces of ILD 106, bottom MTJ stack 204, SCL 208, first spacer 404, second spacer 707, and hardmask 216 using known spacer deposition processes. A CMP can be performed to remove top portions of encapsulation dielectric 806 to expose top portions of hardmask 216 first spacer 404, and second spacer 707. A layer of ILD 908 can be deposited over exposed surfaces of ILD 808, second spacer 707, first spacer 404, and hardmask 216. Encapsulation dielectric 806 can be selectively etched and a metal layer for liner 905 may be deposited over the exposed top surfaces of ILD 808 and 908, encapsulation dielectric 806, bottom MTJ stack 204, SCL 208, first spacer 404, second spacer 707, and hardmask 216. Bit-line 902 with liner 905 is deposited on the exposed top surfaces of hardmask 216, first spacer 404, second spacer 707, and encapsulation dielectric 806. A CMP removes excess bit-line metal from the top surface of ILD 908 to form the wide-base DMTJ structure depicted in FIG. 12 with two spacers.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Methods as described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A double magnetic tunnel junction device, the double magnetic tunnel junction device comprising:
   a bottom magnetic tunnel junction stack;
   a spin conducting layer on the bottom magnetic tunnel junction stack;
   a top magnetic tunnel junction stack on the spin conduction layer, wherein a width of the top magnetic tunnel junction stack is less than a width of the bottom magnetic tunnel junction stack;
   a first dielectric spacer on sides of the top magnetic tunnel junction stack and a portion of a top surface of the spin conduction layer; and
   a second dielectric spacer on the first dielectric spacer, wherein the second dielectric spacer is composed of a material with a lower etch rate than the first dielectric spacer.

2. The double magnetic tunnel junction device according to claim 1, further comprising:
   an etch stop layer on the top magnetic tunnel junction stack;
   a metallic hardmask layer on the etch stop layer; and
   an encapsulation dielectric, wherein (i) the encapsulation dielectric is on the etch stop layer and the metallic hardmask layer and (ii) surrounding sides of the bottom magnetic tunnel junction stack, a bottom portion of sides of the spin conduction layer, a bottom portion of sides of the first dielectric spacer, and sides of the second dielectric spacer.

3. The double magnetic tunnel junction device according to claim 1, wherein sides of the bottom magnetic tunnel junction stack are covered by at least the portion of the spin conduction layer which is under a bottom portion of the first dielectric spacer and a bottom portion of the second dielectric spacer, and wherein the bottom magnetic tunnel junction stack resides on a via.

4. The double magnetic tunnel junction device according to claim 1, wherein a width of a surface of the spin conduction layer is at least substantially the same as a width of a bottom surface of the top magnetic tunnel junction stack, and wherein a width of a bottom surface of the spin conduction layer is at least substantially the same as a width of a top surface of the bottom magnetic tunnel junction stack.

5. The double magnetic tunnel junction device according to claim 1, wherein the second dielectric spacer includes one of tantalum, palladium, or tantalum nitride.

6. The double magnetic tunnel junction device according to claim 1, wherein the second dielectric spacer is composed of a carbon diamond material.

7. The double magnetic tunnel junction device according to claim 1, wherein the first dielectric spacer comprises at least one material selected from the group consisting of silicon nitride, an aluminum oxide, a titanium oxide, a silicon oxide, boron nitride, and silicon boron carbon nitride.

8. The double magnetic tunnel junction device according to claim 1, wherein a bottom surface of the second dielectric spacer resides on a surface of the first dielectric spacer.

9. The double magnetic tunnel junction device according to claim 2, further comprising:
   a liner over the metallic hardmask, the first dielectric spacer, the second dielectric spacer, and the encapsulation dielectric; and
   a bit-line over the liner.

10. A method of forming a double magnetic tunnel junction device, the method comprising:
    forming a via in a via dielectric on a portion of metal layer in a back-end of a line semiconductor structure;
    depositing a stack of material layers for a double magnetic tunnel junction device on the via and the via dielectric;
    patterning and selectively etching a portion of a hardmask and an organic mask on a top portion of the stack of material layers;
    etching a portion of each an etch stop layer, a top magnetic tunnel junction, and a top portion of a spin conduction layer in the stack of material layers;
    depositing a first dielectric spacer material over the back-end of the line semiconductor structure;
    depositing a second dielectric spacer material over the first spacer material, wherein the second dielectric spacer material is composed of a material with a lower etch rate than the first dielectric spacer material;
    removing horizontal portions of the first dielectric spacer material not under the second dielectric spacer material and horizontal portions of the second dielectric spacer material; and
    removing portions of the spin conduction layer, a bottom magnetic tunnel junction in the stack of material layers for the double magnetic tunnel junction device, and a portion of a surface of the via dielectric, wherein:
    the removed portions are not protected by a sidewall of the second dielectric spacer material; and a width of the top magnetic tunnel junction is less than a width of the bottom magnetic tunnel junction.

11. The method of claim 10, wherein forming the via in the via dielectric on the portion of metal layer in the back-end of the line semiconductor structure further comprises the back-end of the line semiconductor structure that is a patterned top magnetic tunnel junction and the hardmask.

12. The method of claim 10, wherein depositing the first dielectric spacer material over the back-end of the line semiconductor structure further comprises performing a partial etch of the first dielectric spacer material.

13. The method of claim 10, wherein the stack of material layers for the double magnetic tunnel junction includes the bottom magnetic tunnel junction, the spin conduction layer on the bottom magnetic tunnel junction, the top magnetic tunnel junction on the spin conduction layer, and an etch stop under a hardmask.

14. The method of claim 10, further comprising:
depositing an encapsulation dielectric over the back-end of the line semiconductor structure;
depositing a first interlayer dielectric over the back-end of the line semiconductor structure;
performing a chemical-mechanical polish to remove a top portion of a hardmask layer, the second dielectric spacer material, the first dielectric spacer material, and the first interlayer dielectric removing a portion of a MRAM stack to form an MRAM pillar;
depositing a second interlayer dielectric; and
forming bit-line, wherein the bit-line includes a liner.

15. The method of claim 10, wherein etching the portion of each the etch stop layer, the top magnetic tunnel junction, and the top portion of a spin conduction layer in the stack of material layers further comprises using the hardmask remaining after patterning as a mask and etching the portion of each the etch stop layer, the top magnetic tunnel junction, and the top portion of a spin conduction layer using one or more of an ion beam etch process or a reactive ion etch process.

16. The method of claim 10, wherein removing portions of the first dielectric spacer material, the spin conduction layer, the bottom magnetic tunnel junction, and the portion of the surface of the via dielectric using one or more of an ion beam etch process or a reactive ion etch process and the second dielectric spacer material creates the top magnetic tunnel junction that is smaller than the bottom magnetic tunnel junction.

17. The method of claim 10, wherein removing portions of the spin conduction layer, the bottom magnetic tunnel junction in the stack of material layers for the double magnetic tunnel junction device, and the portion of the surface of the via dielectric further comprises performing one of a controlled in-situ oxidation process or air-break process.

* * * * *